US011342357B2

(12) United States Patent
Ritter et al.

(10) Patent No.: US 11,342,357 B2
(45) Date of Patent: May 24, 2022

(54) SEMICONDUCTOR DEVICE (71) Applicant: NEXPERIA B.V., Nijmegen (NL)

(72) Inventors: Hans-Martin Ritter, Hamburg (DE); Frank Burmeister, Hamburg (DE)

(73) Assignee: Nexperia B.V., Nijmegen (NL)

(*) Notice: Subject to any disclaimer, the term of this patent is extended or adjusted under 35 U.S.C. 154(b) by 0 days.

(21) Appl. No.: 16/272,185

(22) Filed: Feb. 11, 2019

(65) Prior Publication Data
US 2019/0252409 A1    Aug. 15, 2019

(30) Foreign Application Priority Data
Feb. 9, 2018 (EP) .................................... 18156085

(51) Int. Cl.
*H01L 27/12* (2006.01)
*H01L 23/62* (2006.01)
(Continued)

(52) U.S. Cl.
CPC .... *H01L 27/1203* (2013.01); *H01L 21/76283* (2013.01); *H01L 21/84* (2013.01);
(Continued)

(58) Field of Classification Search
CPC ............. H01L 27/1203; H01L 27/0248; H01L 27/0255; H01L 29/861; H01L 25/043;
(Continued)

(56) References Cited

U.S. PATENT DOCUMENTS 5,025,304 A * 6/1991 Reisman ............... H01L 23/481
257/758
8,101,996 B2 * 1/2012 Wang .................... H01L 25/074
257/334

(Continued)

FOREIGN PATENT DOCUMENTS

| CN | 104617094 A | 5/2015 |
|---|---|---|
| KR | 20040017894 A | 3/2004 |
| KR | 101628754 B1 | 6/2016 |

OTHER PUBLICATIONS

European Search Report for priority European application No. EP 18 15 6085, 2 pages, dated Aug. 8, 2018.
(Continued)

*Primary Examiner* — Natalia A Gondarenko
(74) *Attorney, Agent, or Firm* — Ohlandt, Greeley, Ruggiero & Perle, L.L.P.

(57) ABSTRACT

A semiconductor device structure and method of manufacturing a semiconductor device is provided. The method includes providing a first semiconductor substrate having a first major surface and an opposing second major surface, the first major surface having a first metal layer formed thereon; providing a second semiconductor substrate having a first major surface and an opposing second major surface, with the second semiconductor substrate including a plurality of active device regions formed therein and a second metal layer formed on the first major surface connecting each of the plurality of active device regions; bonding the first metal layer of the first semiconductor substrate to the (Continued)

second metal layer of the second semiconductor substrate; and forming device contacts on the second major surface of the second semiconductor substrate for electrical connection to each of the plurality of active device regions.

14 Claims, 8 Drawing Sheets (51) Int. Cl.
*H01L 23/373* (2006.01)
*H01L 21/84* (2006.01)
*H01L 21/762* (2006.01)
*H01L 27/02* (2006.01)
*H01L 29/861* (2006.01)
*H01L 29/66* (2006.01)

(52) U.S. Cl.
CPC .......... *H01L 23/3735* (2013.01); *H01L 23/62* (2013.01); *H01L 27/0248* (2013.01); *H01L 27/0255* (2013.01); *H01L 29/66121* (2013.01); *H01L 29/861* (2013.01); *H01L 2224/83193* (2013.01); *H01L 2924/1203* (2013.01); *H01L 2924/13055* (2013.01); *H01L 2924/13091* (2013.01)

(58) Field of Classification Search
CPC ... H01L 25/0657; H01L 25/072; H01L 25/50; H01L 24/05; H01L 24/29; H01L 24/32; H01L 24/83; H01L 23/3672; H01L 23/3736; H01L 23/3735; H01L 23/62; H01L 2224/02126; H01L 2224/05572; H01L 2224/83193; H01L 2224/838; H01L 2224/83805; H01L 2224/83851; H01L 2224/8383; H01L 2224/83825; H01L 2224/83895; H01L 2224/32145; H01L 2224/29124; H01L 2224/29144; H01L 21/4882; H01L 21/76283; H01L 21/84; H01L 29/66136; H01L 29/8613; H01L 29/732; H01L 29/66272; H01L 29/66121; H01L 2924/00014; H01L 2924/13055; H01L 2924/13091; H01L 2924/1203
USPC ....... 257/347, 753, 23.145, 23.151; 438/637, 438/455, 618
See application file for complete search history.

(56) References Cited

U.S. PATENT DOCUMENTS

| | | | | |
|---|---|---|---|---|
| 8,373,449 | B2* | 2/2013 | Thiele | G01R 19/0092 |
| | | | | 327/103 |
| 8,456,856 | B2* | 6/2013 | Lin | H01L 24/92 |
| | | | | 361/783 |
| 8,629,553 | B2* | 1/2014 | Farooq | H01L 27/0688 |
| | | | | 257/713 |
| 9,620,434 | B1 | 4/2017 | Joshi et al. | |
| 10,049,884 | B2* | 8/2018 | Wood | H03K 17/68 |
| 2009/0278167 | A1 | 11/2009 | OZoe | |
| 2010/0237386 | A1 | 9/2010 | Lin et al. | |
| 2010/0289092 | A1 | 11/2010 | Perng et al. | |
| 2013/0200520 | A1* | 8/2013 | Nguyen | H01L 23/488 |
| | | | | 257/753 |
| 2014/0353724 | A1 | 12/2014 | Fujita | |
| 2016/0133598 | A1* | 5/2016 | Baudin | H01L 24/83 |
| | | | | 257/777 |
| 2017/0236800 | A1* | 8/2017 | Gondcharton | H01L 24/27 |
| | | | | 438/458 |
| 2017/0345798 | A1* | 11/2017 | Yu | H01L 21/6835 |
| 2020/0212914 | A1* | 7/2020 | Lee | H03K 19/1776 |

OTHER PUBLICATIONS

Written Opinion for priority European application No. EP 18 15 6085, 3 pages.

* cited by examiner

SEMICONDUCTOR DEVICE

CROSS REFERENCE TO RELATED APPLICATIONS

This application claims benefit under 35 U.S.C. § 119(a) of European Patent Application No. EP18156085.5 filed Feb. 9, 2018, the entire contents of which are incorporated herein by reference.

BACKGROUND OF THE DISCLOSURE

1. Field of the Disclosure

The present disclosure relates to a semiconductor device structure and method of manufacture. In particular the present disclosure relates to semiconductor device structure comprising donor substrate and a bonded carrier substrate.

2. Description of Related Art

Chip scale semiconductor packages (CSP) are characterised by being direct surface mountable packages. CSPs are arranged having all external contacts on one surface of the package thus enabling the package to be mounted on a carrier, such as a printed circuit board. CSPs typically contain diode and/or transistor device structures which are arranged vertically within the package, such that the dominant current flow within the device structures is inherently vertical. However, because CSPs are arranged to have contacts on one surface the current must flow to another contact on the same side, therefore the vertical current flow through the active region of the device structure has to change direction to a lateral direction, through the substrate, and then change direction back to vertical in order to reach the second contact. Due to limited conductivity of the bulk semiconductor material the current density in the bulk and in the device structures and contacts will therefore be non-uniform. Current density in parts of the device structures that are nearer to a second contact may be higher. Additionally, current crowding occur at the edges of the contacts of device structures. As a consequence the maximum allowable total current through the device structures and contacts will be smaller than in a case where a second contact is placed on another surface of the semiconductor crystal and where the current through the bulk is always vertical and where therefore the current density within the device structures is in principle the same for the whole area of the device structure.

In addition, parasitic current paths may occur between device structures which affect performance. These problems are also particularly relevant for transient voltage suppression devices where localised heating can result in device failure.

SUMMARY

According to an embodiment there is provided a method of manufacturing a semiconductor device, the method comprising: providing a first semiconductor substrate having a first major surface and an opposing second major surface, the first major surface having a first metal layer formed thereon; providing a second semiconductor substrate having a first major surface and an opposing second major surface, wherein the second semiconductor substrate comprises a plurality of active device regions formed therein and a second metal layer formed on the first major surface connecting each of the plurality of active device regions; bonding the first metal layer of the first semiconductor substrate to the second metal layer of the second semiconductor substrate; and forming device contacts on the second major surface of the second semiconductor substrate for electrical connection to each of the plurality of active device regions.

Optionally, the method may comprise bonding the first metal layer of the first semiconductor substrate to the second metal layer of the second semiconductor substrate to form a metal layer disposed between two semiconductor layers.

Optionally, the first and second metal layer may gold or aluminium.

Optionally, the method may also comprise, thinning the opposing second major surface of the second semiconductor substrate prior to bonding the first metal layer to the second metal layer.

Optionally, the method may also comprise, forming one or more trench regions extending from the first major surface to the opposing second major surface of the second semiconductor substrate. The method may further comprise filling the trench regions with an insulating material.

Optionally, the second semiconductor substrate may be a silicon on insulator substrate. Optionally, the plurality of active device regions are bidirectional active device regions.

According to an embodiment there is also provided a semiconductor device comprising: a first semiconductor substrate having a first major surface and an opposing second major surface, the first major surface having a first metal layer formed thereon; and a second semiconductor substrate having a first major surface and an opposing second major surface, wherein the second semiconductor substrate comprises a plurality of active device regions formed therein and a second metal layer formed on the first major surface connecting each of the plurality of active device regions; wherein the first metal layer of the first semiconductor substrate is bonded to the second metal layer of the second semiconductor substrate; and device contacts are arranged on the second major surface of the second semiconductor substrate for electrical connection to each of the plurality of active device regions.

The first metal layer of the first semiconductor substrate may be bonded to the second metal layer of the second semiconductor substrate to form a metal layer disposed between two semiconductor layers.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 1:
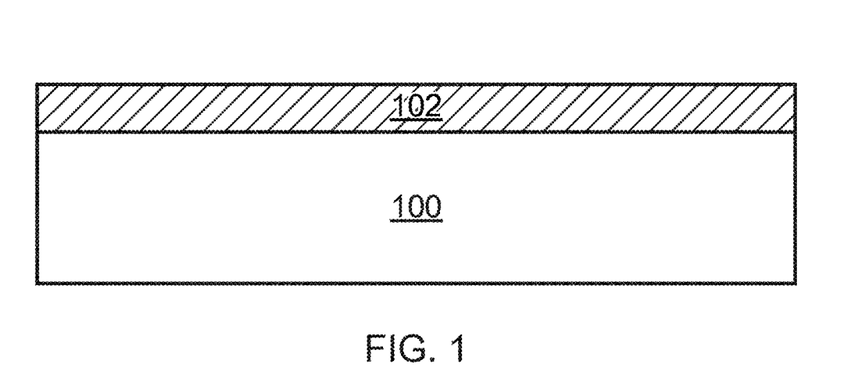
FIG. 1 illustrates a carrier substrate or wafer comprising a metal contact layer formed thereon.

An example method of forming the semiconductor device according to embodiments is described with reference to FIGS. 1 to 6. The process may commence with a carrier wafer or first substrate 100 as illustrated in FIG. 1. A first metal electrically conducting layer 102 may be formed on a first major surface of the carrier wafer or first substrate 100. The first metal layer 102 may be deposited on the first substrate 100 by any appropriate process such as evaporation or sputtering. The first metal layer 102 may be formed from for example from aluminium, gold, titanium, tungsten, platinum or alloys thereof. The first substrate 100 may be a semiconductor substrate such as a silicon substrate and may be a doped or undoped substrate. Preferably the first metal layer 102 forms an ohmic contact with the first substrate 100.

Figure 2:
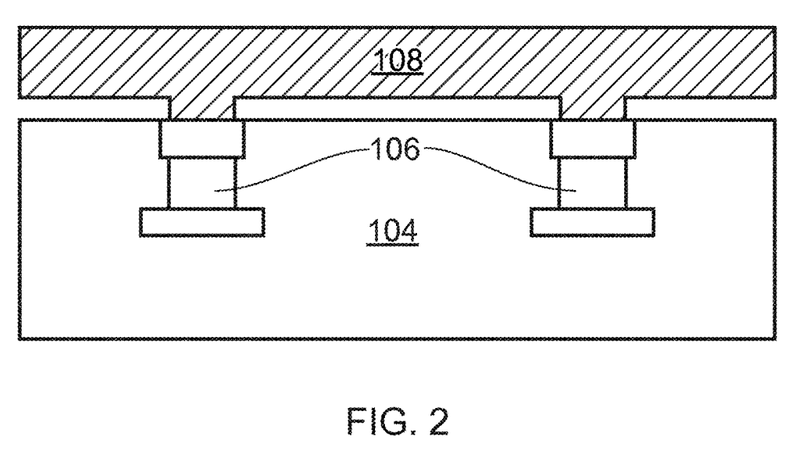
FIG. 2 illustrates donor substrate or wafer comprising active regions connected to a metal contact layer formed thereon.

As shown in FIG. 2 a donor wafer or second substrate 104 is provided. One or more active semiconductor device regions 106 may be formed in the second substrate 104. A second metal electrically conducting layer 108 may be formed on a first major surface of the second substrate 104 and the second metal layer 108 may be electrically connected to contact regions of the one or more semiconductor device regions 106 formed in the second substrate 104. The semiconductor device regions 106 may be formed by diffusion and or implantation into the second substrate 104 and some examples of semiconductor device region structures are discussed with reference to FIGS. 3a and 3b below.

Figure 3A:
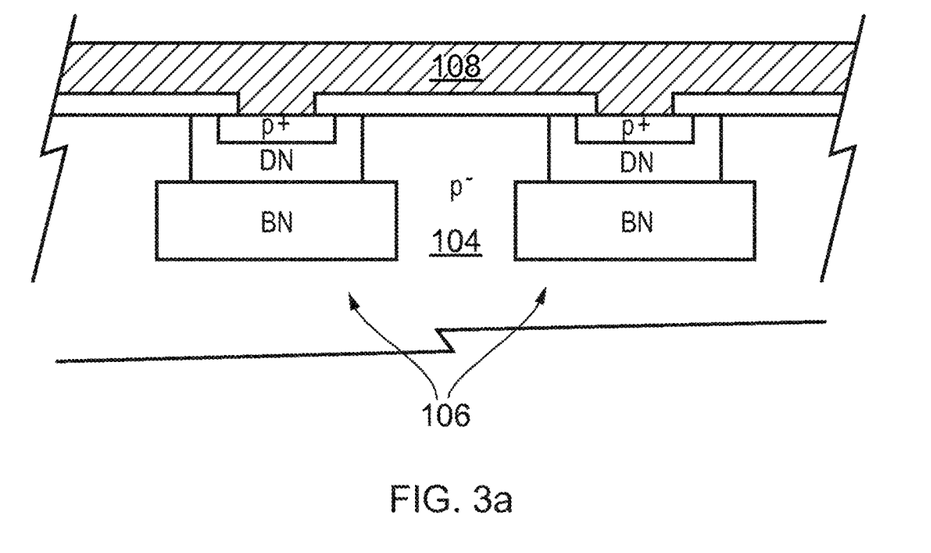
FIG. 3a illustrates an example back to back diode active region structure according to embodiments.

With reference to FIG. 3a, a back-to-back diode structure is illustrated. In this example, the active regions 106 are formed in a lightly doped p− second substrate 104. Each of the cathodes of the active regions 106 in this example are formed of buried highly doped n type regions (BN) followed by deep highly doped n (DN) regions forming the cathode regions of the diodes. The anode regions are formed in the substrate of highly doped p+ region and the anode contact is made to the highly doped p+ region of the active regions 106 using the second metal layer 108.

To this end the back-to-back diode structure is an anode to anode connected structure and the formation and arrangement of the cathode contacts is discussed in more detail below with reference to FIG. 6.

Figure 3B:
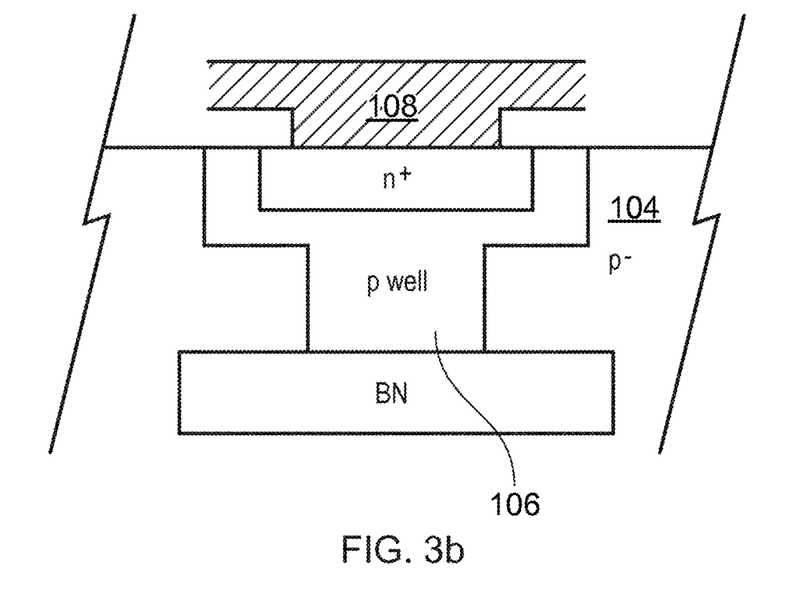
FIG. 3b illustrates an example open base transistor active region structure according to embodiments.

FIG. 3b illustrates a further example of an example active structure 106. In this case the active structure 106 is a so-called open base transistor formed in a lightly doped p− second substrate 104. The active region 106 in this example is formed of a buried highly doped n type region (BN) forming the emitter region, followed by a p-well base region, which is in turn followed by a highly doped n+ collector region. The collector contact is made to the highly doped n+ region of the active regions 106 using the second metal layer 108. Since open base devices are bidirectional type devices, the role of emitter and collector will change depending on polarity, only the (floating) base will remain the base when the polarity is reversed.

Embodiments of the present disclosure are not limited to the device structures as illustrated in FIG. 3a or 3b, and the skilled person would clearly see that any appropriate device structure combination of structures, or number of structures may be arranged and implemented without departing from the concept of this disclosure. In all embodiments the metal layer 108 may connect to the several device structures.

Figure 4:
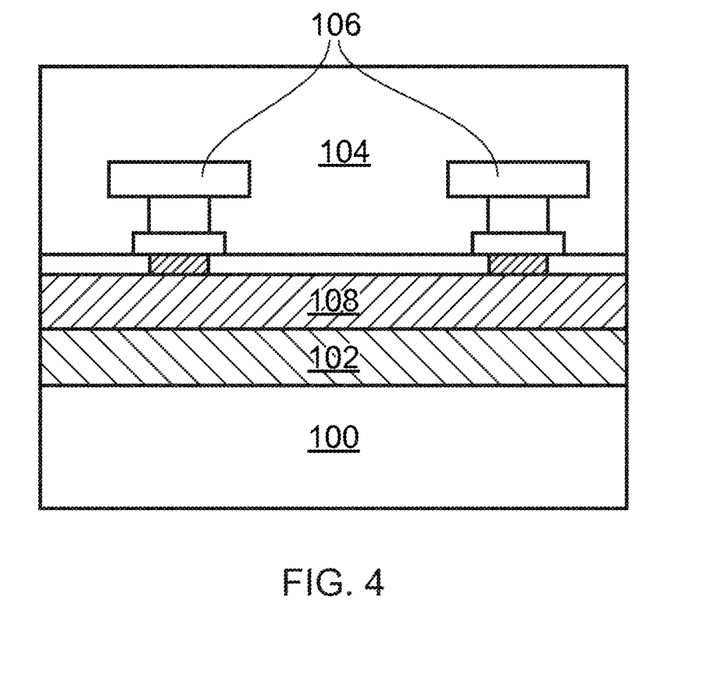
FIG. 4 illustrates a donor substrate bonded to a carrier substrate prior to wafer thinning.

Following formation of the first metal layer 102 on the first substrate 100 and the active regions 106 in the second substrate 104 and the second metal layer 108, the first 100 and second 104 substrates are bonded together. As illustrated in FIG. 4, the first metal layer 102 is bonded to the second metal layer 108.

In this regard the bonded first 102 and second 108 metal layers can, from an electrical point of view be considered as one multi-layer layer structure. In this way, the first metal layer 102 bonded to the second metal layer 108 can be considered as a buried metal layer, that is, buried between the first 100 and second 104 substrates.

Examples of bonding techniques can include thermocompression bonding. The first 102 and second 108 metal layers are brought into atomic contact by the simultaneous application of heat and force. Atoms from the crystal lattice of the first metal layer migrate to the crystal lattice of the second metal layer based on a crystal lattice vibration and this atomic interaction results in the first metal layer being bonded to the second metal layer. Alternatively, formation of an intermetallic bond layer such as a eutectic alloy layer may be used as a bonding material. Further alternatives of bonding layers may include simultaneous adhesive-metal bonding or simultaneous fusion-metal bonding.

Figure 5:
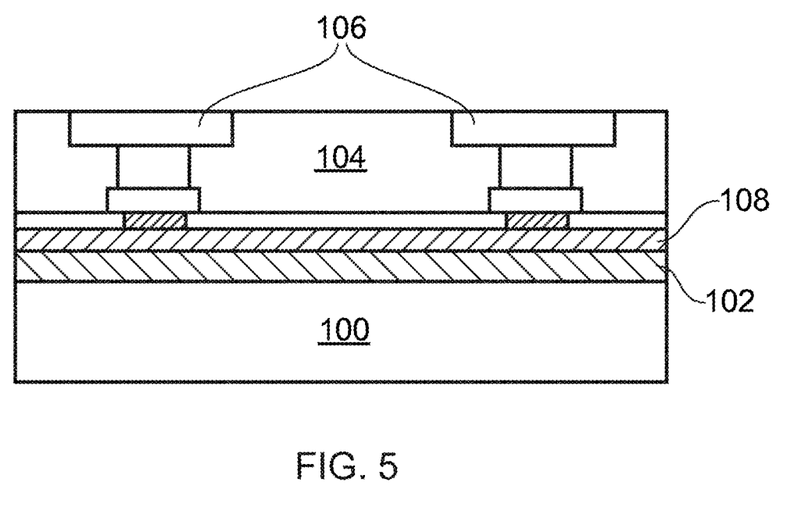
FIG. 5 illustrates a donor substrate bonded to a carrier substrate following wafer thinning.

As illustrated in FIG. 5, following bonding of the first 100 and second 104 substrates together, the second substrate 104 may be thinned on the major side opposite the second metal layer 108 to expose portions of the active regions 106. For example, following examples presented in FIG. 3a or 3b, the second substrate 104 may be thinned by any appropriate etching or grinding process to remove a portion of the second substrate 104 to expose the highly doped n+ region (BN). This removal of a portion of the second substrate 104 allow appropriate formation of contacts to the exposed regions of the active regions 106.

Figure 6:
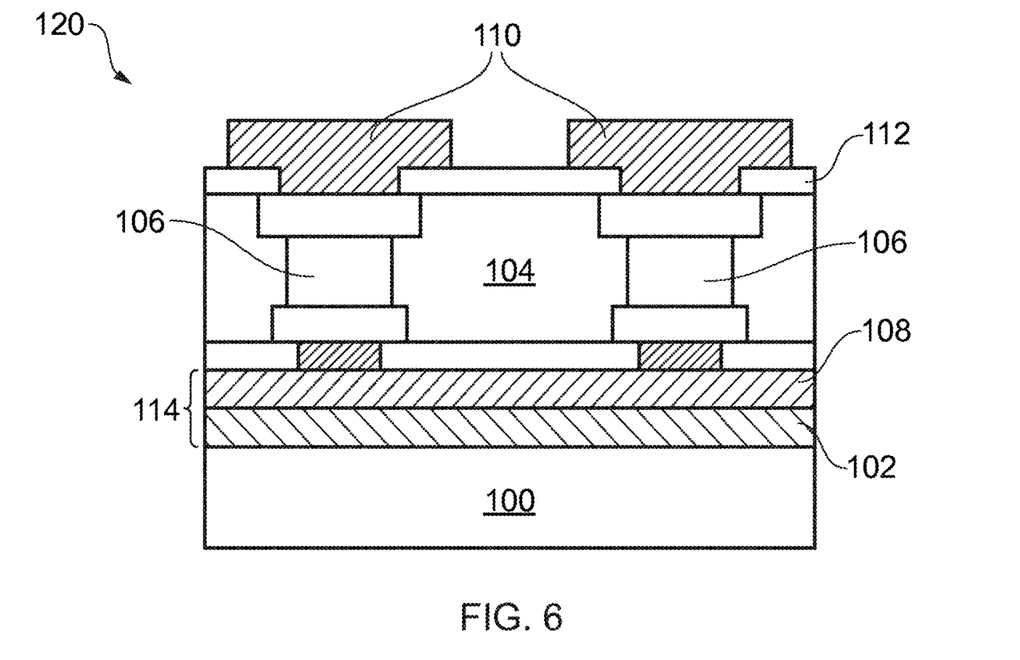
FIG. 6 a semiconductor device formed from the donor substrate and the carrier substrate according to embodiments.

The completed semiconductor device 120 is illustrated in FIG. 6, which shows formation of appropriate contacts 110 on the active regions 106. An optional isolation layer 112 may be formed, on the side of the second substrate 104 opposite to the second metal layer 108, prior to formation of the contacts 110.

The active regions 106 are formed in the second substrate 104 prior to bonding the first substrate 100 to the second substrate 104. Therefore, all high temperature diffusion processes required to form the active regions 106 are completed on the second substrate 104 prior to bonding. As a result, low melting point metals such as gold or aluminium can be used in the bonding process because there will be no out diffusion of the bonding metal. Furthermore, following bonding of the first and second metal layers creating the buried metal layer, high temperature processing of the device (that is to form the various diffusion regions) is difficult. This would require metals with high melting points to withstand the temperatures required to form the various diffusion regions and could result in severe mechanical problems such as wafer bending or degradation of the metal layer. It is advantageous therefore to carry out all high temperature processes, such as diffusion processes prior to the wafer bonding.

Furthermore, the resistance of the bonded metal layers 102, 108 can be controlled by appropriate selection of the metal and/or the metal thickness.

In an alternative process to that of FIG. 5, the second substrate 104 may be thinned on the major side opposite the second metal layer 108 to expose portions of the active regions 106 prior to bonding of the first metal layer 102 to the second metal layer 108. Furthermore, depending on the thickness or the depth to which the active regions 106 are formed in the second substrate 104, the second substrate 104 may require no thinning or localised thinning to expose the active regions 106 such that suitable contacts 110 may be formed.

Optionally, the first substrate 100 may be thinned prior to further processing of the completed device 120. This may include partial thinning of the first substrate 100 to reduce its thickness and or localised thinning to facilitate singulation of the device from an array of such devices.

Figure 7:
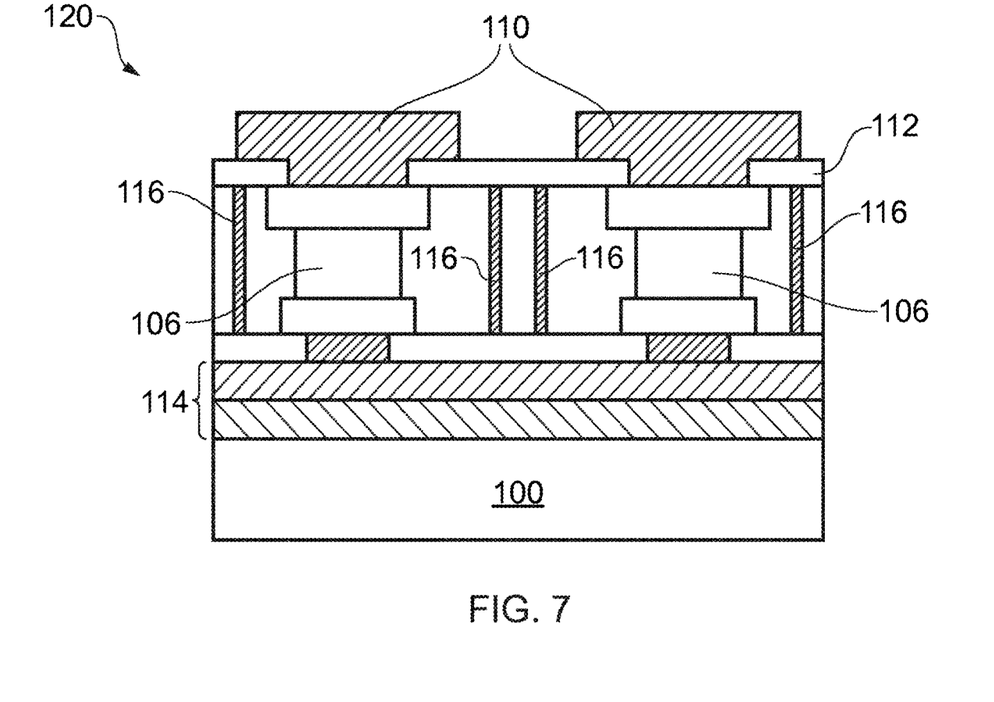
FIG. 7 illustrates a semiconductor device formed from the donor substrate and the carrier substrate according to embodiments.

FIG. 7 illustrates semiconductor device 120 according to an embodiment. The donor wafer or second substrate 104 may comprise at least one trench 116 extending from the first major surface of the second substrate 104 to the opposing second major surface, and is located between the active regions 106. The at least one trench 116 may be filled with an electrically insulating material such an oxide, and serves to isolate the active regions 106 to prevent parasitic current flow through the second substrate 104 between the active regions.

The at least one trench 116 may be formed in the second substrate 104 whilst forming the active regions 106. As illustrated, trenches 116 may also be arranged at the edges of the device 120 to prevent parasitic current flow, such as leakage currents, from the edge of the device 120. In cases where the second device structure is not an active structure but a simple contact to the bulk semiconductor material, the resistance between that contact and the buried metal layer can be reduced by connecting the contact to the buried metal layer with a conductive trench. This can have the effect of reducing the on-resistance of the device.

In terms of operation and with reference to FIG. 6, embodying the back to back diode arrangement of FIG. 3a or the open base transistor arrangement of FIG. 3b, current may flow from one of the contacts 110 though one of the active regions 106 and into the multi-layer metal layer formed of the first 102 and second 108 metal layers. The current then passes though the multi-layer metal and the other active region 106 and up to the other contact 110.

As a result of the multilayer metal structure formed by the first 102 and second 108 metal layers the current distribution vertical to the surface is substantially uniform. In other words, the current density per area is substantially identical across the whole area of the device structure. The resistance of the multilayer metal structure is very small with a sheet resistance 1-20 mOhm when compared to the current path of bulk semiconductor which would have a sheet resistance of 200-1000 mOhm. As a result the current density at the inner edges and at the outer edges of the device will be substantially uniform, unlike the known arrangements.

Furthermore, the differential on-resistance is very small for the same reasons. The buried metal layer effectively shortens the bulk that is normally part of the current path. Therefore the on-resistance of the device according to embodiments is reduced by 180-990 mOhm. In addition, because the silicon part of the current path, that is the vertical path, is small, current will travel from the top contacts to buried metal layer in a vertical direction only, because the silicon resistance of that path is small.

Furthermore, the introduction of the multilayer metal structure 114 provides for improved heat dissipation from the active regions 106 of the device 120 during operation. Specifically heat generated during operation of the device 120 will be conducted away from the active region 106 by the multilayer metal structure thereby increasing the current robustness of the device 120.

In an alternative to the above described embodiments, the donor wafer or second substrate 104 may be a SOI (Silicon-on-Insulator) wafer. Following formation of the active regions 106 in the SOI wafer and the formation of the second metal electrically conducting layer 108 on the on the first major surface, the SOI wafer may be bonded to the first substrate 100 as described above with reference to FIG. 4. The oxide layer of the SOI wafer may act as the optional isolation layer 112, having appropriate contacts 110 formed there through to contact to the active regions 106 as discussed above with respect to FIG. 6.

If the oxide layer of the SOI wafer is a buried oxide, the SOI wafer may be thinned on the major surface opposite the second metal layer 108 to expose the buried oxide. As mentioned above the buried oxide may act as the optional isolation layer 112, and appropriate contacts may be formed there through to connect to the active regions 106. Trenches 116, as discussed with respect to FIG. 7, may also be formed in the SOI wafer.

As mentioned with respect to FIGS. 3a and 3b above, the skilled person will appreciate that the arrangement of active layers is not limited to the examples of back-to-back diodes or open based transistors. Based on the above teaching the skilled person will appreciate that the concept of a buried metal layer is applicable to different types of semiconductor device structures. For example devices or any combination of devices such as vertical MOS diodes, trench MOS transistors, insulated gate bipolar transistors (IGBT) and/or vertical bipolar transistors may be arranged as active regions 106.

The above described embodiments are particularly suited to semiconductor devices used for transient voltage suppression (TVS) which during operation may be required to shunt excess current when the transient voltage exceeds the avalanche breakdown potential of the device. TVS devices typically suppress all transient voltages above the breakdown voltage of the device and because these transient voltages generate heat in the device the buried metal layer formed of the first 102 and second 108 metal layers improves the heat sinking capability of the device whilst also reducing the on-resistance of the device. The device is improved due to the inclusion of an additional heat and current conductive path.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

What is claimed is:

1. A method of manufacturing a semiconductor device, the method comprising:
    providing a first semiconductor substrate having a first major surface and an opposing second major surface, the first major surface having a first metal layer formed thereon;
    providing a second semiconductor substrate having a first major surface and an opposing second major surface, wherein the second semiconductor substrate comprises a plurality of active device regions formed therein and a continuous second metal layer formed on the first major surface and laterally across an entire width of entire semiconductor device to connect each of the plurality of active device regions; bonding the first metal layer of the first semiconductor substrate directly to the second metal layer of the second semiconductor substrate to form a buried metal layer disposed between two semiconductor layers and configured so that a current distribution vertical to the surface is substantially uniform and a current density per area is substantially identical across a whole area of the device; and
    forming device contacts on the second major surface of the second semiconductor substrate for electrical connection to each of the plurality of active device regions.

2. The method of claim 1, further comprising bonding the first metal layer of the first semiconductor substrate to the second metal layer of the second semiconductor substrate using a gold bonding layer or an aluminum bonding layer.

3. The method of claim 1, further comprising thinning the opposing second major surface of the second semiconductor substrate prior to bonding the first metal layer to the second metal layer.

4. The method of claim 1, further comprising forming one or more trench regions extending from the first major surface to the opposing second major surface of the second semiconductor substrate.

5. The method of claim 4, further comprising filling the trench regions with an insulating material.

6. The method of claim 1, wherein the second semiconductor substrate is a silicon on insulator substrate.

7. The method of claim 1, wherein the plurality of active device regions are bidirectional active device regions.

8. A semiconductor device comprising:
    a first semiconductor substrate having a first major surface and an opposing second major surface, the first major surface having a first metal layer formed thereon;
    a second semiconductor substrate having a first major surface and an opposing second major surface, wherein the second semiconductor substrate comprises a plurality of active device regions formed therein and a continuous second metal layer formed on the first major surface and laterally across an entire width of the entire semiconductor device to connect each of the plurality of active device regions;
    wherein the first metal layer of the first semiconductor substrate is bonded directly to the second metal layer of the second semiconductor substrate to form a buried metal layer disposed between two semiconductor layers and configured so that a current distribution vertical to the surface is substantially uniform and a current density per area is substantially identical across a whole area of the device; and
    a plurality of device contacts are arranged on the second major surface of the second semiconductor substrate for electrical connection to each of the plurality of active device regions.

9. The semiconductor device of claim 8, wherein the first metal layer and the second metal layer are either gold or aluminum.

10. The semiconductor device of claim 8, further comprising one or more trench regions extending from the first major surface to the opposing second major surface of the second semiconductor substrate.

11. The semiconductor device of claim 10, wherein the trench regions are filled with an insulating material.

12. The semiconductor device of claim 8, wherein the second semiconductor substrate is a silicon on insulator substrate.

13. The semiconductor device of claim 8, wherein the plurality of active device regions are bidirectional active device regions.

14. The semiconductor device of claim 8, wherein the buried metal layer has a sheet resistance of 1-20 mOhm.

* * * * *